United States Patent
Xu et al.

(10) Patent No.: US 12,129,569 B2
(45) Date of Patent: Oct. 29, 2024

(54) METHOD FOR CONDITIONING SEMICONDUCTOR PROCESSING CHAMBER COMPONENTS

(71) Applicant: Lam Research Corporation, Fremont, CA (US)

(72) Inventors: Lin Xu, Fremont, CA (US); David Joseph Wetzel, Santa Clara, CA (US); John Daugherty, Fremont, CA (US); Hong Shih, Cupertino, CA (US); Satish Srinivasan, Newark, CA (US); Yuanping Song, Newark, CA (US); Johnny Pham, San Jose, CA (US); Yiwei Song, Morgan Hill, CA (US); Christopher Kimball, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/795,509

(22) PCT Filed: Feb. 16, 2021

(86) PCT No.: PCT/US2021/018204
§ 371 (c)(1),
(2) Date: Jul. 26, 2022

(87) PCT Pub. No.: WO2021/167897
PCT Pub. Date: Aug. 26, 2021

(65) Prior Publication Data
US 2023/0092570 A1  Mar. 23, 2023

Related U.S. Application Data
(60) Provisional application No. 62/978,610, filed on Feb. 19, 2020.

(51) Int. Cl.
C25D 7/04 (2006.01)
C25D 3/44 (2006.01)
(Continued)

(52) U.S. Cl.
CPC .................. *C25D 7/04* (2013.01); *C25D 3/44* (2013.01); *C25D 5/48* (2013.01); *C25D 11/08* (2013.01);
(Continued)

(58) Field of Classification Search
None
See application file for complete search history.

(56) References Cited

U.S. PATENT DOCUMENTS 5,641,375 A  6/1997  Nitescu et al.
6,521,046 B2  2/2003  Tanaka et al.
(Continued)

FOREIGN PATENT DOCUMENTS

JP   11-043734       2/1999
KR   10-2001-0078324 8/2001
KR   10-0859955      9/2008

OTHER PUBLICATIONS

Imetra, "Silicon Carbide Material Properties", <https://www.imetra.com/silicon-carbide-material-properties/>, accessed Nov. 29, 2023.*
(Continued)

*Primary Examiner* — Xiaobei Wang
(74) *Attorney, Agent, or Firm* — Beyer Law Group LLP

(57) ABSTRACT

A method for making a component for use in a semiconductor processing chamber is provided. A component body is formed from a conductive material having a coefficient of thermal expansion of less than $10.0 \times 10^{-6}$/K. A metal oxide layer is then disposed over a surface of the component body.

7 Claims, 8 Drawing Sheets

(51) Int. Cl.
    *C25D 5/48*     (2006.01)
    *C25D 11/08*     (2006.01)
    *H01J 37/32*     (2006.01)
    *H01L 21/683*     (2006.01)

(52) U.S. Cl.
    CPC .. *H01J 37/32642* (2013.01); *H01J 37/32715* (2013.01); *H01L 21/6833* (2013.01); *H01J 2237/2007* (2013.01); *H01J 2237/334* (2013.01); *Y10T 428/12542* (2015.01); *Y10T 428/12576* (2015.01); *Y10T 428/12583* (2015.01); *Y10T 428/12667* (2015.01); *Y10T 428/12806* (2015.01)

(56) References Cited

U.S. PATENT DOCUMENTS

| | | | | |
|---|---|---|---|---|
| 6,613,442 B2* | 9/2003 | O'Donnell | .......... | C23C 16/4404 |
| | | | | 428/697 |
| 6,620,520 B2* | 9/2003 | O'Donnell | ........ | H01J 37/32477 |
| | | | | 118/715 |
| 6,830,622 B2* | 12/2004 | O'Donnell | ............. | C04B 35/50 |
| | | | | 148/272 |
| 8,128,750 B2* | 3/2012 | Kenworthy | ......... | C23C 16/4404 |
| | | | | 118/715 |
| 9,337,002 B2* | 5/2016 | Daugherty | ........ | H01J 37/32559 |
| 2005/0064248 A1* | 3/2005 | O'Donnell | ............ | C23C 28/042 |
| | | | | 428/702 |
| 2007/0215279 A1* | 9/2007 | Koshiishi | .......... | H01J 37/32642 |
| | | | | 156/914 |
| 2008/0241517 A1* | 10/2008 | Kenworthy | ............ | C25D 11/04 |
| | | | | 216/2 |
| 2012/0132532 A1 | 5/2012 | Kenworthy et al. | | |
| 2014/0272459 A1* | 9/2014 | Daugherty | ............ | C23C 28/345 |
| | | | | 438/758 |
| 2020/0335376 A1* | 10/2020 | Sun | ................... | H01L 21/68735 |

OTHER PUBLICATIONS

Cadence System Analysis, "The Importance of Matching the CTE of Silicon", <https://resources.system-analysis.cadence.com/blog/msa2021-the-importance-of-matching-the-cte-of-silicon>, accessed Feb. 29, 2024.*
International Search Report from International Application No. PCT/US2021/018204 dated Jun. 8, 2021.
Written Opinion from International Application No. PCT/US2021/018204 dated Jun. 8, 2021.

* cited by examiner

METHOD FOR CONDITIONING SEMICONDUCTOR PROCESSING CHAMBER COMPONENTS

CROSS-REFERENCE TO RELATED APPLICATIONS

This application claims priority to, and the benefit of, U.S. Provisional Patent application No. 62/978,610 filed on Feb. 19, 2020, which is incorporated herein by reference for all purposes.

BACKGROUND

The present disclosure generally relates to the manufacturing of semiconductor devices. More specifically, the disclosure relates to semiconductor processing chamber components, and methods of manufacturing/conditioning thereof, for use in processing of a substrate or wafer.

During semiconductor wafer processing, plasma processing chambers are used to process semiconductor devices. Plasma processing chambers are subjected to plasmas, halogen and/or oxygen, which may degrade components in the plasma processing chambers. Some plasma processing chambers have silicon parts, such as electrodes, showerheads, and edge rings.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

To achieve the foregoing and in accordance with the purpose of the present disclosure, a method for making a component for use in a semiconductor processing chamber is provided. A component body is formed from a conductive material having a low coefficient of thermal expansion e.g. a coefficient of thermal expansion of less than $10.0 \times 10^{-6}/K$). A metal oxide layer is then disposed over a surface of the component body.

In another manifestation, a component for use in a plasma processing chamber is provided. The component has a component body. The component body comprises a conductive material having a low coefficient of thermal expansion (e.g. a coefficient of thermal expansion of less than $10.0 \times 10^{-6}/K$). A metal oxide layer is disposed over a surface of the component body.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 6A is a top view of a component substrate in the form of an edge ring. FIG. 6B is a cross-sectional view of the component substrate of FIG. 6A. FIG. 6C is a cross-sectional detail view of the surface of the substrate of FIG. 6A. FIG. 6D is cross-sectional detail view of a high-purity aluminum layer electroplated to the substrate of FIG. 6A. FIG. 6E is a cross-sectional detail view of the electroplated structure of FIG. 6D after anodization to form a component for a plasma processing chamber.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Various embodiments described herein provide semiconductor processing chamber components that are resistant to damage by arcing and/or erosion by processes such as plasma etching and thus inhibit or minimize consumption of the component that may occur from plasma and etching processes inherent in semiconductor processing systems such as a plasma processing chamber.

Figure 1:
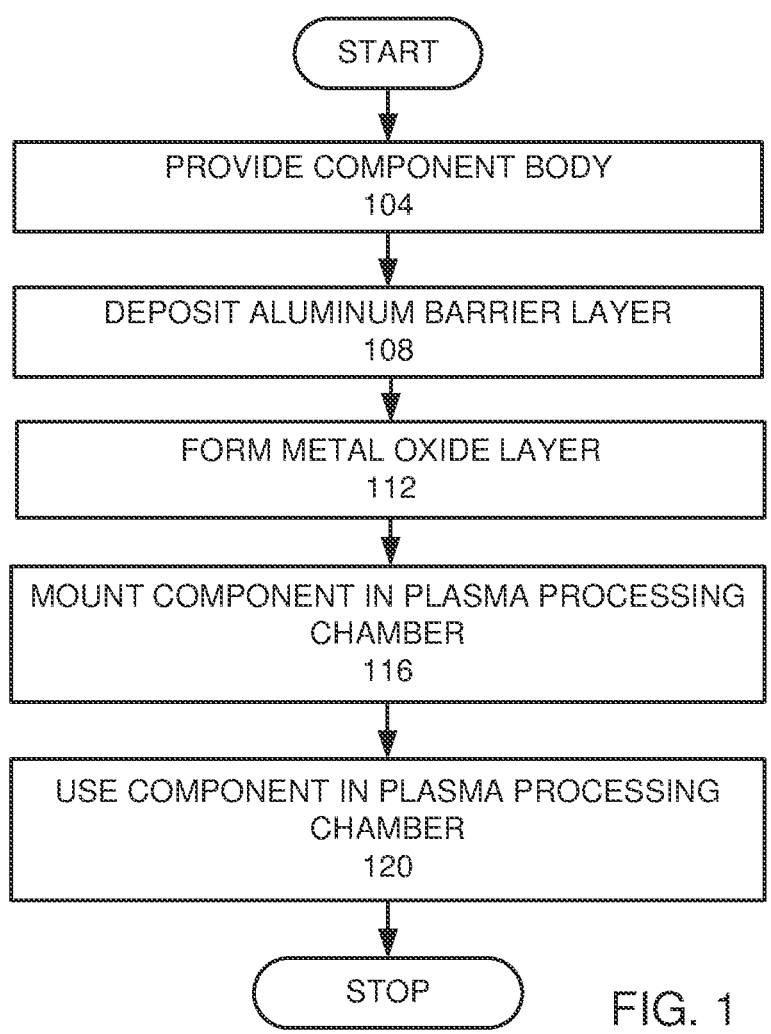
FIG. 1 is a high level flow chart of an embodiment.
Figure 2A:
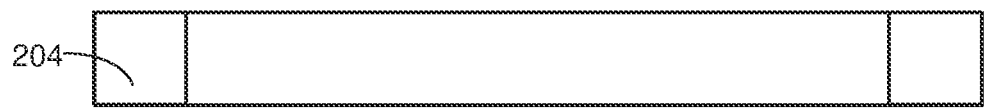
FIG. 2A-C is a schematic cross-sectional view of an edge ring processed according to an embodiment.

To facilitate understanding, FIG. 1 is a high level flow chart of a process of a first embodiment of fabricating and using a component for a semiconductor processing chamber such as a plasma processing chamber. A component body is provided (step 104). The component body comprises an electrically-conductive material having a low linear coefficient of thermal expansion (CTE). In one embodiment, a "low-CTE" material is defined as a material having a CTE of less than $10.0 \times 10^{-6}/K$. In a further embodiment, a "low-CTE" material is defined as a material having a CTE of less than $5.0 \times 10^{-6}/K$). As will be explained in further detail below, the electrical conductivity and low-CTE of the component body are particularly beneficial attributes for use in components of semiconductor processing chambers such as a plasma processing chambers. In one embodiment, the component body is formed by casting a conductive semiconductor or low-CTE metal to form a specified component shape, e.g. by pouring or injecting a molten semiconductor or metal into a mold. In an embodiment where an electrically conductive semiconductor material is cast, the molten semiconductor cools and hardens in the mold to form a multicrystalline structure having a large grain size. In another embodiment, the component body is formed by sintering a conductive semiconductor powder to form a conductive ceramic component. FIG. 2A is a schematic cross-sectional view of a component body 204. In this example, the component body 204 forms an edge ring. In this embodiment, the component body 204 is formed from a conductive semiconductor of silicon, silicon carbide or graphite. Conductive silicon or silicon carbide is provided by doping the silicon or silicon carbide. In another embodiment, component body 204 is formed from an electrically conductive, low-CTE metal such as titanium, molybdenum, or the like.

Figure 2B:
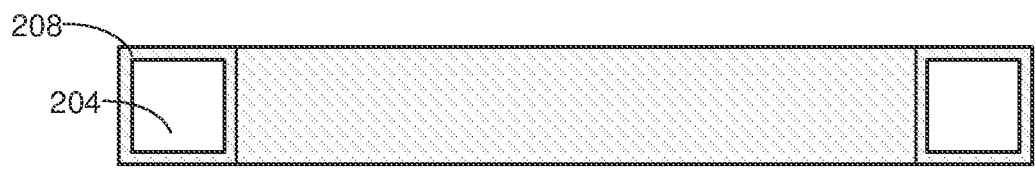

An aluminum barrier layer is deposited on the component body 204 (step 108). In this embodiment, electroplating is used to provide an aluminum layer that is 99.9% pure by mass. The process of electroplating involves a standard electrochemical cell where the part to be plated is the cathode and the anodes are ultra-high purity aluminum and both components are immersed in an electrolyte. To provide an aluminum barrier layer with sufficiently high purity, a conductive organic-based solution instead of a water-based solution is desired. FIG. 2B is a schematic cross-sectional view of the component body 204 after the aluminum barrier layer 208 has been deposited. In this example, the aluminum barrier layer 208 encapsulates the component body 204. In other embodiments, the aluminum barrier layer 208 may be on one surface of the component body 204.

Figure 2C:
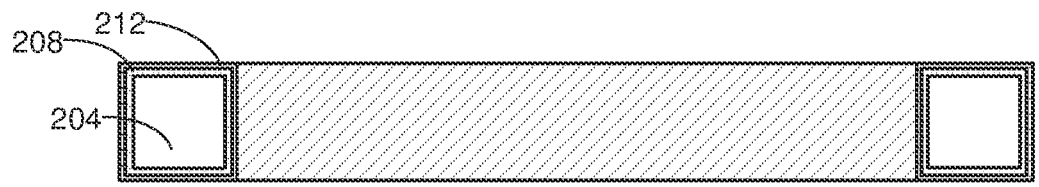

A metal oxide layer is formed by anodization (step 112). In this embodiment, the surface of the aluminum barrier layer 208 is hard anodized (also referred to as hard coating or Type III anodization), so that the metal oxide layer is aluminum oxide ($Al_2O_3$). The hard anodization process forms an extremely hard abrasion resistant porous oxide on the surface of the aluminum barrier layer 208 which is of high Al purity. The anodization setup is also a typical electrochemical cell where the pure Al coated part is the anode in an acid bath (typically sulfuric acid). When current is passed in the electrochemical cell, hydrogen is released at the cathode and oxygen at the surface of the aluminum anode, thereby creating the buildup of aluminum oxide. FIG. 2C is a cross-sectional view of the component body after the surface of the aluminum barrier layer 208 has been hard anodized to form the metal oxide layer 212. Since the aluminum barrier layer 208 has a high purity, the anodization process also results in providing the metal oxide layer 212 with high purity.

Figure 3:
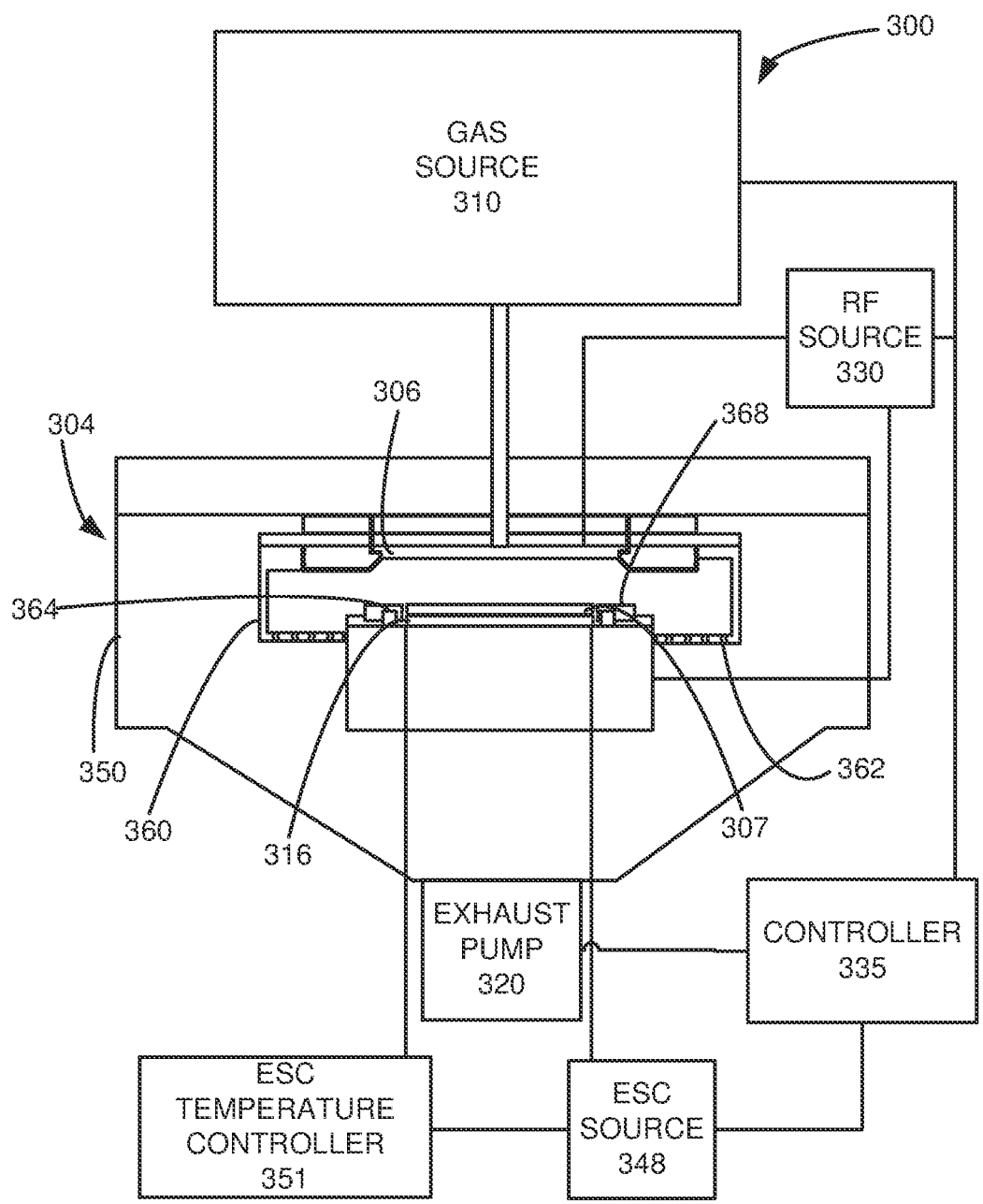
FIG. 3 is a schematic view of a plasma processing chamber that may be used in an embodiment.

The component body is mounted in a semiconductor processing chamber such as a plasma processing chamber (step 116). In this example, the component body is used as an edge ring. FIG. 3 is a schematic view of a plasma processing chamber 300 for plasma processing substrates, in which the component may be installed in an embodiment. In some embodiments, the plasma processing chamber 300 comprises a gas distribution plate 306 providing a gas inlet and an electrostatic chuck (ESC) 316, within a plasma processing chamber 304, enclosed by a chamber wall 350. Within the plasma processing chamber 304, a substrate 307 is positioned on top of the ESC 316. The ESC 316 may provide a bias from an ESC power source 348. A gas source 310 is connected to the plasma processing chamber 304 through the gas distribution plate 306. An ESC temperature controller 351 is connected to the ESC 316 and provides temperature control of the ESC 316. A radio frequency (RF) power source 330 provides RF power to the ESC 316 and an upper electrode. In this embodiment, the upper electrode is the gas distribution plate 306. In a preferred embodiment, 13.56 megahertz (MHz), 2 MHz, 60 MHz, and/or optionally, 27 MHz power sources make up the RF power source 330 and the ESC power source 348. A controller 335 is controllably connected to the RF power source 330, the ESC power source 348, an exhaust pump 320, and the gas source 310. A high flow liner 360 is a liner within the plasma processing chamber 304. The high flow liner confines gas from the gas source and has slots 362. The slots 362 maintain a controlled flow of gas to pass from the gas source 310 to the exhaust pump 320. An edge ring 364 surrounds the substrate 307 and is mostly shielded from plasma by a quartz ring 368. An example of such a plasma processing chamber is the Flex® etch system manufactured by Lam Research Corporation of Fremont, CA The process chamber can be a CCP (capacitively coupled plasma) reactor or an ICP (inductively coupled plasma) reactor.

The plasma processing chamber 304 uses the edge ring 364 to plasma process the substrate 307 (step 120). The plasma processing may be one or more processes of etching, depositing, passivating, or another plasma process. The plasma processing may also be performed in combination with non-plasma processing. Such processes may expose the edge ring 364 to plasmas containing halogen and/or oxygen.

Edge rings are generally consumable items as a result of their location and function in semiconductor processing chambers. It is desirable that the top surface of an edge ring be level with a top surface of the substrate. Therefore, various mechanisms may be provided to move the etch ring as the edge ring is consumed in order to keep the top surface of the edge ring even with the top surface of the substrate. In addition, once an edge ring is sufficiently consumed, the edge ring must be replaced, causing downtime for the plasma processing chamber. In other embodiments, such components may be placed in locations shielded from plasma. Edge rings ideally have a low coefficient of thermal expansion and good electrical and thermal conductivity.

In this embodiment, the hard-anodized metal oxide layer 212 is sufficiently etch-resistant against plasma erosion, so that the edge ring is either no longer a consumable, or is minimally consumable so it does not need to be changed as often. The electroplating of aluminum to form a high purity aluminum barrier layer 208 removes any alloys or other impurities from the aluminum that is to be hard-anodized. The high purity aluminum barrier layer 208, when oxidized provides a more etch resistant aluminum oxide layer and prevents the generation of impurities during plasma processing. In addition, electroplating of the aluminum barrier layer 208 forms a thin uniform and conformal layer of aluminum. The hard anodization may only slightly increase the thickness of the resulting hard-anodized layer. As a result, machining would not be needed to smooth and/or thin the hard-anodized layer in order for the edge ring to fit in the plasma processing chamber 300. In addition, the thin protective layer of the hard-anodized layer is less subject to thermal expansion issues. Electroplating the aluminum barrier layer 208 and hard anodizing the aluminum barrier layer 208 are relatively inexpensive processes that are capable of providing the metal oxide layer 212. In this embodiment, the aluminum barrier layer 208 deposited by electroplating has a thickness in the range of 1 micron to 100 microns. The metal oxide layer 212 formed by hard anodization has high purity and has a thickness of between 5 microns to 100 microns. The high purity metal oxide layer 212 is more etch resistant than metal oxide layers of lower purity.

Various plasma processing chambers 300 may use other components with the aluminum or metal oxide layer or coating. Such components include ESC's 316, pinnacles, high flow liners 360, gas distribution plates 306, among others. The aluminum or metal oxide coating is most useful for consumable plasma processing chamber components.

The integrity of dielectric coatings is crucial to maintain both electrical standoff and chemical resistance. Thicker dielectric coatings are more susceptible to cracking. Thinner dielectric coatings do not provide sufficient insulation to prevent damage caused by the voltage used by the plasma processing chamber 300.

In various embodiments, a plasma electrolytic oxidation (PEO) or anodization Types I, II, or III may be used to anodize the surface of the aluminum barrier layer 208 to create the metal oxide layer 212. In other embodiments, the metal oxide layer 212 is spray-coated on the aluminum barrier layer 208. The spray coating may be a thermal spray coating or plasma spray coating. Thermal spray/plasma spray is the best method to build a thick coating. In some embodiments, aerosol deposition may be used to provide a dense coating. However, aerosol deposition may be more challenging for 3D geometries. Spray coatings may form thicker and non-uniform coatings. As a result, machining may be required to smooth the metal oxide layer 212 if a spray coating is used. In some embodiments, a thicker metal oxide layer 212 may be desired to provide an improved fit. If a thinner metal oxide layer 212 is desired, then machining would be used to thin the metal oxide layer 212. In various embodiments, chemical vapor deposition or various spraying processes or other deposition processes may be used to deposit the aluminum barrier layer 208. A thermal spray metal oxide coating process includes a heat source (flame or plasma) that melts the raw material (in powder form) into tiny droplets and sprays them onto substrates at high velocity. Such a process can deposit thick coatings on complex geometries at high deposition rates compared to other coating technologies.

In other embodiments, other metal oxides may be deposited on the aluminum barrier layer 208 by thermal spraying. Such other metal oxides may be yttria ($Y_2O_3$), ternary yttria-alumina oxides such as yttrium aluminum garnet ($Y_3Al_5O_{12}$ (YAG)), yttrium aluminum monoclinic ($Y_4Al_2O_9$ (YAM)), or yttrium aluminum perovskite ($YAlO_3$ (YAP)), or YSZ (yttria stabilized zirconia).

Figure 4:
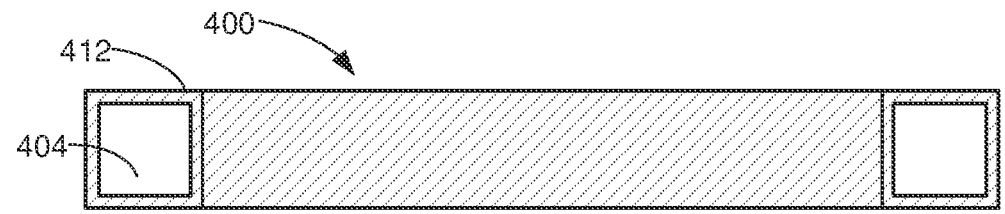
FIG. 4 is a schematic cross-sectional view of an edge ring processed according to another embodiment.

In another embodiment, instead of depositing an aluminum barrier layer 208 (step 108), a metal oxide layer is thermal sprayed directly on the surface of the component body 204. FIG. 4 is a cross-sectional schematic view of a component 400 where a metal oxide layer 412 is sprayed directly on the component body 404. The metal oxide layer 412 deposited by thermal spraying may have a thickness in the range of 0.5 to 2 mm.

Figure 5:
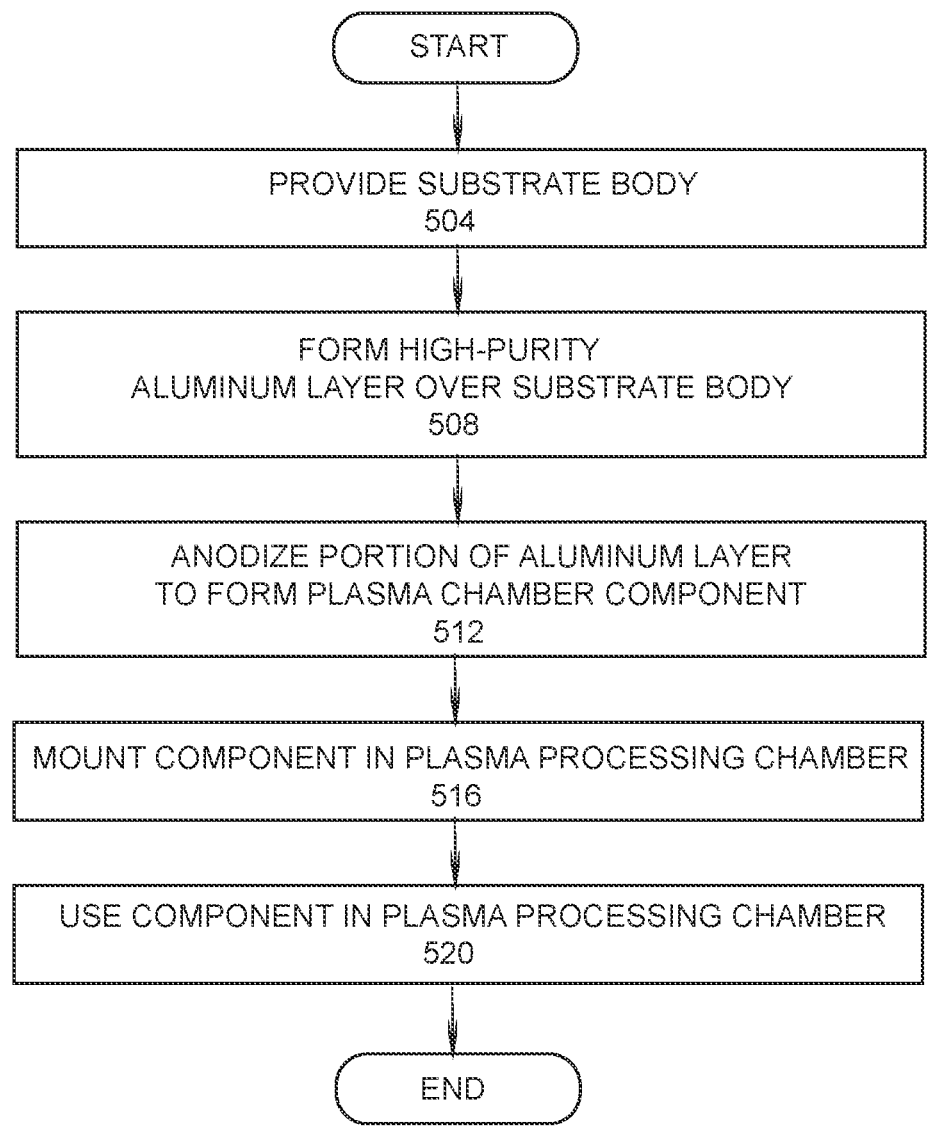
FIG. 5 is a high level flow chart of another embodiment.
Figure 6A:
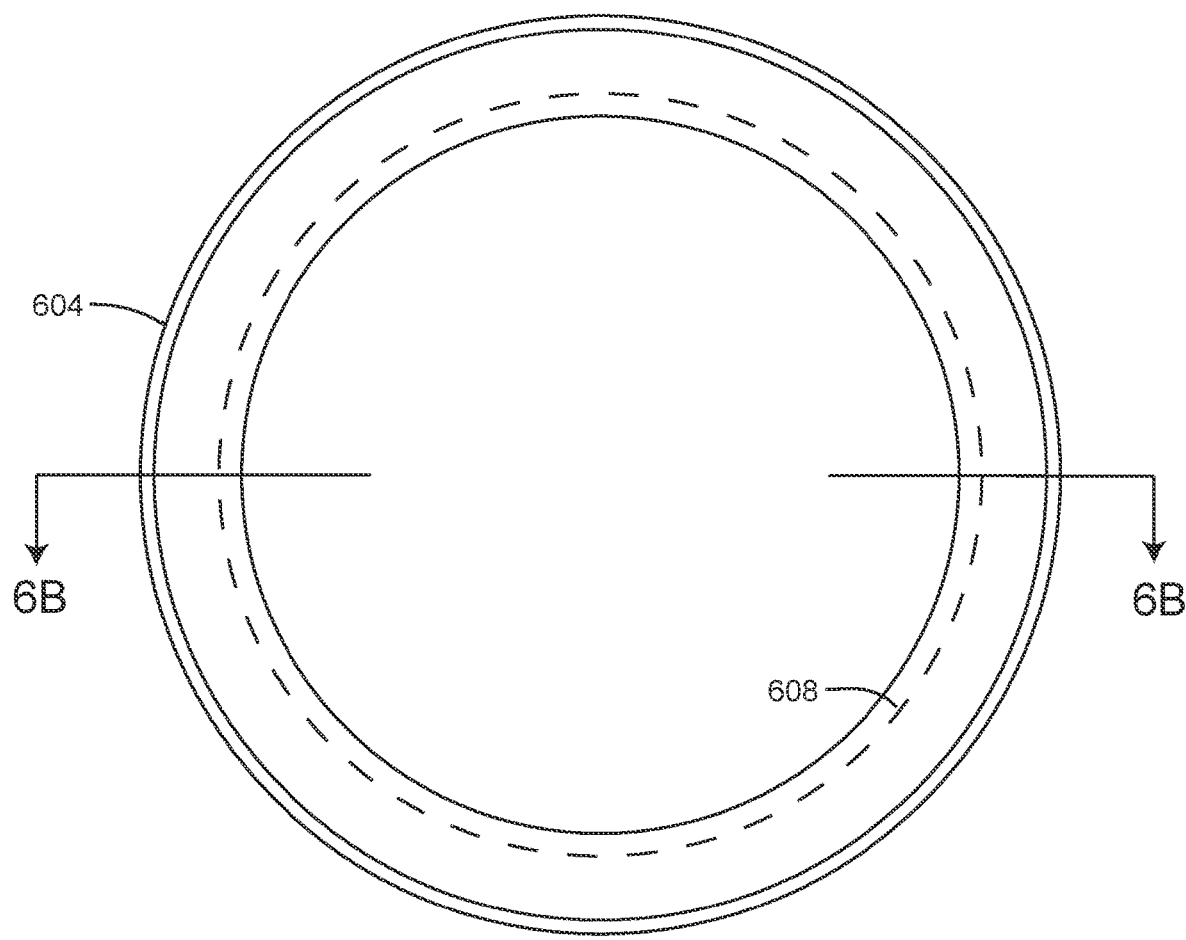
FIG. 6A-FIG. 6E show another embodiment of a method for fabricating an edge ring component for use in a plasma processing chamber.
Figure 6B:
Figure 6C:
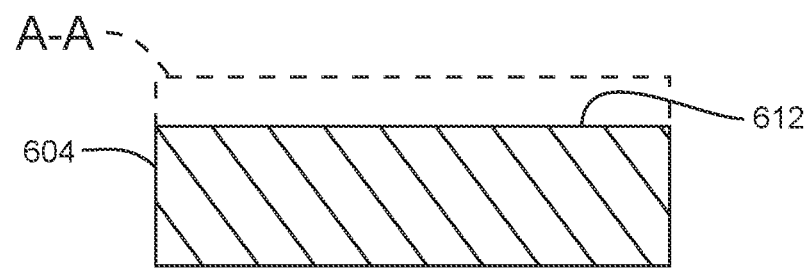

FIG. 5 shows a high level flow chart of a second embodiment of a method of fabricating and using a component for a semiconductor processing chamber such as a plasma processing chamber. A substrate body is provided (step 504). Referring to FIG. 6A through FIG. 6C, the provided substrate body 604 may be formed in the shape of a component for use in a plasma processing chamber, such as an edge ring having central bore 608 at least partially surrounding an electrostatic chuck (ESC). FIG. 6A is a top view of the substrate body, and FIG. 6B is cross-section view of the substrate body. FIG. 6C shows a close-up view of a section A-A of the substrate body surface 612. It is appreciated that the images shown in FIG. 6A through FIG. 8 are for illustrative purposes only and may vary with regard to scale, form, and features. The substrate body 604 may be formed via a number of various fabrication processes, e.g. machining, molding, sintering, polishing, chemical etching, etc.

According to an embodiment, the substrate body 604 comprises an electrically-conductive material having a low coefficient of thermal expansion (e.g. less than $10.0 \times 10^{-6}$/K). In a further embodiment, the substrate body 604 comprises an electrically conductive semiconductor, and in particular an electrically conductive multi-crystalline doped-silicon or silicon carbide semiconductor material. In alternative embodiments, the substrate body may comprise other electrically-conductive semiconductors (e.g., germanium, graphite, etc.), or other low-CTE metals such as titanium, molybdenum, etc. In various embodiments, the semiconductor may be multi-crystalline. Multi-crystalline silicon has grains that are one average larger than grains of polycrystalline silicon. Multi-crystalline silicon has an average grain size that is over 1 mm. The low coefficient of thermal expansion generally provides less stress, abrasion, and a better fit between components. In particular during chamber processing, the edge ring and other adjacent parts (ESC baseplate in particular) will be at different temperatures. Due to the heating caused by plasma, the edge ring is generally much hotter (in the range of 150° C. to 250° C.) than the ESC baseplate, of which the temperature is actively controlled (in the range of −40° C. to 50° C.). When we choose an edge ring material with small thermal expansion coefficient, we effectively reduce the variation of the gap size between edge ring and adjacent parts (ESC), so that a more consistent capacitance between the two conductors can be achieved. As a result, electrically we will have a more consistent performance.

Figure 6D:
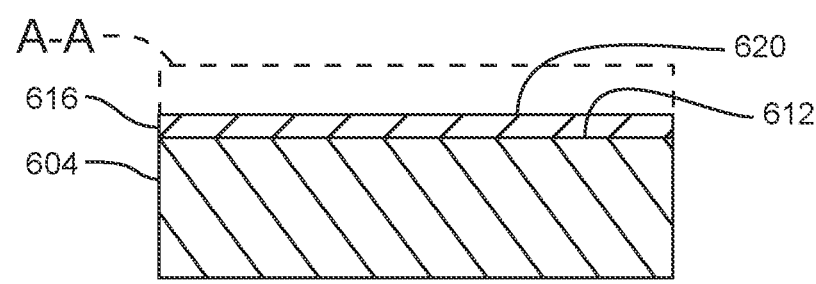

Referring to FIG. 5 and FIG. 6D, after the substrate body 604 is provided, a high-purity aluminum layer 616 (FIG. 6D) is formed over the surfaces 612 of the substrate body 604 (step 508). According to some embodiments, the aluminum layer 616 is deposited using an electroplating deposition method that provides a substantially uniform and defect-free aluminum layer 616 of high purity aluminum and having a high bond-strength with the underlying substrate body 604. In alternative embodiments, deposition methods such as atomic layer deposition (ALD) or plasma electrolytic oxidation (PEO) may be employed. In one embodiment, the silicon substrate is processed to remove or substantially remove any oxides (e.g. silicon oxide) and superficial damage resulted by the fabrication process from the surface prior to aluminum deposition. This may also be performed in the electroplating process to ensure no or very little oxides, oxidation, or loose particles exist between the aluminum layer 616 and substrate body 604.

The aluminum layer 616 helps aid the formation of an anodized layer 624 (described below) that is more uniform, has minimal porosity, and has lower trace contaminants compared to anodization of aluminum alloys (such as Al 6061). The combined aluminum layer 616/anodized 624 provides a corrosion resistant barrier against aggressive plasma environments and also provides voltage standoff protection from the high voltage plasma environment. According to an embodiment, the aluminum layer 616 is at least 99% pure aluminum by mass. According to another embodiment, the aluminum layer 616 is at least 99.5% pure aluminum by mass. According to yet another embodiment, the aluminum layer 616 is at least 99.9% pure aluminum by mass. In one embodiment, the electroplating step 508 is conducted via an AlumiPlate process (AlumiPlate, Inc., Coon Rapids, MN), wherein the purity of the electroplated aluminum layer 616 comprises greater than 99.99% pure aluminum by mass.

The thickness of aluminum layer 616 may be varied upon one or more factors, including type of component, location of the component, geometry of the component, substrate material properties, cost, etc. According to one embodiment, the thickness of aluminum layer 616 is between about 20 micrometers (μm) to 150 μm. In another embodiment, the thickness of aluminum layer 616 is between about 25 μm to 125 μm. According to another embodiment, the thickness of aluminum layer 616 is between about 25 µm and 50 µm. In a further embodiment, the thickness of aluminum layer 616 is between about 25 µm and 35 µm.

Figure 6E:
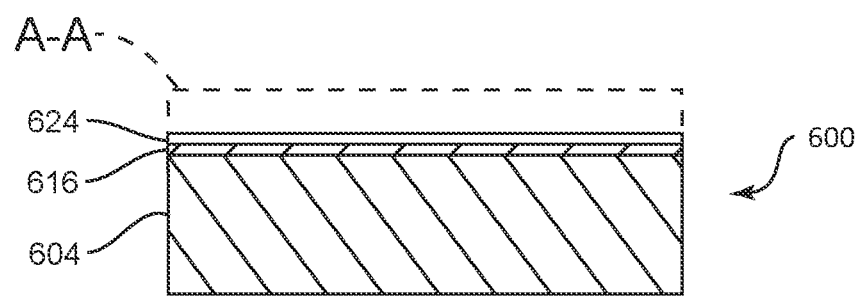

Referring to FIG. 5 and FIG. 6E, after the aluminum layer 616 is formed, the surface 620 of the aluminum layer 616 is anodized (step 512), forming a plasma processing component 600 with an anodized layer 624. FIG. 6E shows a cross-sectional view of an embodiment of a portion of the silicon substrate 604 after anodization. As shown in FIG. 6E, a portion of the aluminum layer 616 is penetrated to generate the anodized layer 624, while still leaving at least a portion of the aluminum layer 616 between the anodized layer 624 and substrate 604. Additional layer depth of the anodized layer 624 is additive above the original surface 620 of the aluminum layer 616, thus increasing the overall thickness of the part. In one embodiment, the depth of anodized layer 624 is approximately 50% penetration below surface 620, and 50% additional deposition above surface 620. It is desirable to have at least a portion of the aluminum layer 616 intact (i.e., non-anodized), as it provides a significant benefit in the bond between the anodized layer 624 and substrate 604 interfaces. Because the anodized layer 624 and silicon substrate body 604 are relatively hard surfaces, the soft, malleable aluminum layer acts as a buffer to mitigate thermal stresses imposed on the layers during the plasma etching process in the chamber. If the thermal stress is not mitigated, the anodized layer may separate from the silicon substrate body 604 when subjected to temperature changes. In various embodiments, when the anodized layer 624 and silicon substrate body 604 were subjected to several extreme thermal cycles, the aluminum layer 616 prevented separation. In addition, the formation of silicon oxide will cause thermal cracking at the interface between the silicon substrate body 604 and the anodized layer 624. The thermal cracking creates exposed parts of the silicon substrate body 604. The exposed parts of the silicon substrate body 604 will be eroded.

In one embodiment, the anodization step 512 comprises a hard coat or Type III anodization process (also referred to as hard anodization or hard-coat anodization), wherein the aluminum-plated silicon substrate 604 is subjected to a sulfuric acid bath at a temperature of 0° C. to 3° C. and high voltage (starting as 25V DC and increasing to 60-100V as the process continues) to create the oxide or "anodization" layer. The Type III anodization process produced an anodized layer 624 with a thickness up to or greater than about 50 µm. In this embodiment, no water seal or other hydrothermal or precipitation means is performed after anodization; as such seal has a higher likelihood of cracking or degrading from the plasma process. The anodization process creates columns with spaces. The spaces provide room for expansion of the columns without cracking. Sealing removes or reduces the spaces so that when columns expand because of thermal heating the anodization layer is more likely to crack. The cracks reduce the protection provided by the layer. In addition, sealing may cause the formation of Boehmite, and thus reduce the surface abrasion resistance. In addition, other anodization processes such as type II or mix-acid or oxalic acid could be used to convert the plating Al into an anodization protective layer.

In some embodiments, the anodized oxide layer 614 is at least 10 µm thick and can be as thick as 50 µm or more. In other embodiments, the anodized oxide layer 614 has a thickness in a range of 5 µm and 50 µm. In other embodiments, the anodized oxide layer 614 has a thickness in a range of 12 µm and 38 µm. In a further embodiment, the anodized oxide layer 614 has a thickness in a range of 25 µm and 35 µm. In various embodiments, the part of the aluminum layer 616 that is not anodized has a thickness in the range of 7 µm to 113 µm. In various embodiments, the part of the aluminum layer 616 that is not anodized has a thickness in the range of 12 µm to 32 µm.

According to an embodiment, the anodized layer 624 is an aluminum oxide layer with a purity of at least 99% aluminum oxide by mass. According to another embodiment, the anodized oxide layer 614 is an aluminum oxide layer with a purity of at least 99.5% aluminum oxide by mass. According to yet another embodiment, the anodized layer 624 is an aluminum oxide layer with a purity of at least 99.9% aluminum oxide by mass.

The resultant aluminum/anodized layer 616/624 fabricated according to steps 504 through 512 of the process of FIG. 5, as detailed above, has minimized contaminants (for example zinc content at 5 ppm as compared to typical 180 ppm found in 6061 aluminum alloy) and increased corrosion resistance (hydrochloric acid (HCl) bubble test resulting in a tested resistance as high as 140 hours compared to 5-13 hours for 6061 aluminum anodized with either mixed or oxalic acids). Furthermore, the aluminum layer 616/anodized layer 624 has a dielectric strength, measured as high as 2500 V per 0.001".

After the component 600 is properly processed via steps 504 through 512 of FIG. 5, it is then installed in a semiconductor processing chamber, such as a plasma processing chamber (step 516, FIG. 5). The fabrication process illustrated in FIG. 5 is particularly useful for fabricating consumable dielectric plasma processing chamber components. More specifically, the component 600 formed from the processes illustrated in FIG. 5, and FIG. 6A through FIG. 6E is particularly suited for forming and/or conditioning one or more components of a plasma processing chamber to inhibit or minimize consumption of the component via plasma, reactive halogen species, or other energetic ions and etching processes inherent in the plasma processing chamber.

In the following embodiments, the component 600 formed from the processes illustrated in FIG. 5, and FIG. 6A through FIG. 6E is directed to a particular application as an edge ring or similar component within an electrostatic chuck (ESC) assembly or system (e.g., ESC assembly 700 in FIG. 7) for use in a plasma processing chamber (e.g. plasma processing chamber 804 shown in FIG. 8). However, it is appreciated that the component 600 formed from the processes illustrated in FIG. 5, and FIG. 6A through FIG. 6E may be implemented as any number of components within the ESC assembly 700 or plasma processing chamber 804, such as pinnacles and electrostatic chucks (ESC's), in addition to high flow liners, gas distribution plates, etc., among other parts, to the extent the properties of high corrosion resistance, good electrical conductivity, and low coefficient of thermal expansion are desired.

Figure 7:
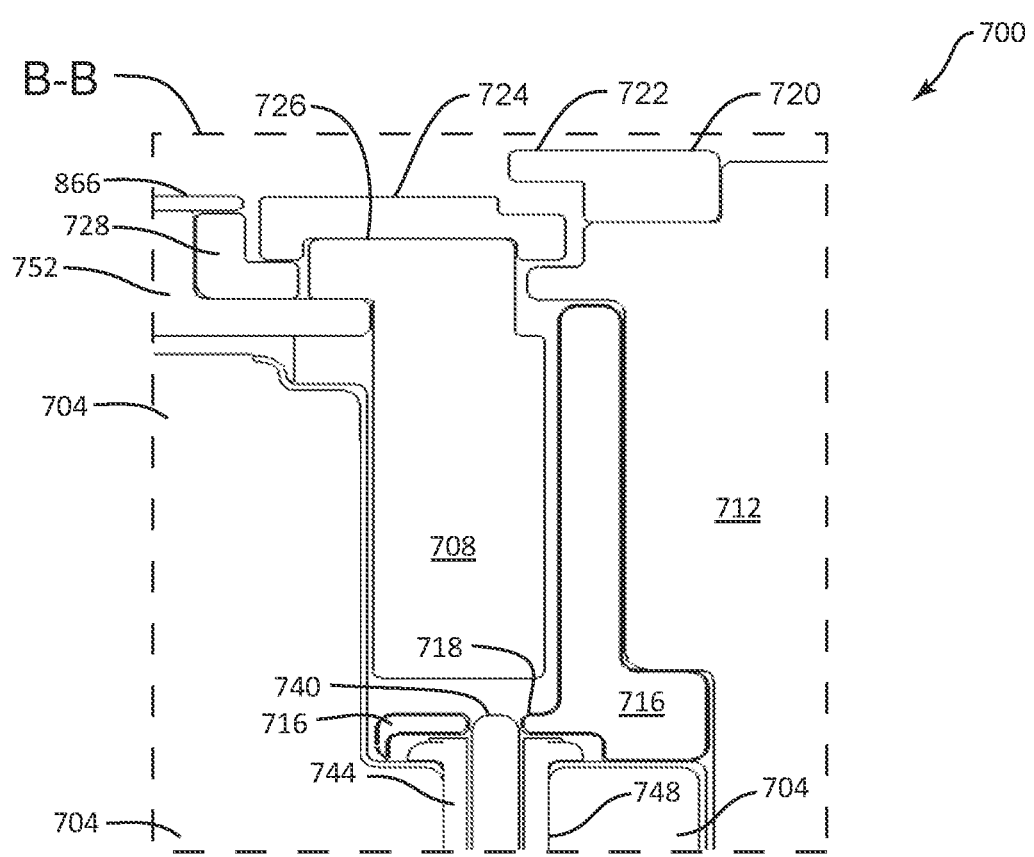
FIG. 7 is a section view of a portion of a plasma processing chamber.

FIG. 7 illustrates a section view of a portion (defined by section B-B shown in FIG. 8) of an ESC assembly 700 having a movable edge ring configuration for use in a plasma processing system. ESC assembly 700 includes a top edge ring 724 configured to surround an electrostatic chuck (ESC) 704. ESC 704 may also be referred to as a substrate support that acts as a support for process wafer 866 during processing. The top edge ring 724 has an annular lower recess 726 that is supported by a movable edge ring 708. The movable edge ring 708 is disposed to vertically articulate within a cavity defined by an inner radial side comprising the ESC 704, heating plate 752, and middle inner edge ring 728, and an outer radial side comprising a static edge ring 716, outer edge ring 712 and cover edge ring 720. The cover edge ring 720 has a radial inner protrusion 722 partially covering the top edge ring 724.

Because the top edge ring 724 is exposed to erosive plasma and etchants in the processing of process wafer 866, it invariably becomes worn and thus its thickness is reduced in height with increasing exposure. Accordingly, the movable edge ring 708 is used to raise the top edge ring 724 to restore the height relationship between a top surface of the top edge ring 724 and the process wafer/substrate 866. To affect such height adjustment, one or more lift pins 740 are vertically actuated (through an aperture 748 in the ESC 704 and aperture 718 in static edge ring 716) to push up the movable edge ring 708, which in turn adjusts the vertical orientation of the top edge ring 724. A sleeve 744 is disposed about the circumference of the lift pin 740 to seal off the aperture 748 of the ESC 704.

According to an embodiment, component 600 is fabricated in accordance with the processes of FIG. 5, and FIG. 6A through FIG. 6E to form a movable edge ring 708 for mounting in ESC assembly 700. Due to its location in the chamber and proximity/exposure to plasma in the processing of process wafer 866 (i.e. bearing one or more "plasma-facing surfaces"), the movable edge ring 708 benefits greatly from the anti-corrosion properties of the aluminum layer 616/anodized layer 624 of the component 600. In an example, plasma may pass between the top edge ring 724 and the outer edge ring 712 and cover edge ring 720 to an outer surface of the movable edge ring 708 and an inner surface of the static edge ring 716. The amount of plasma that is passed is dependent on the position of the top edge ring 724. In addition, in the position shown in FIG. 8, the top edge ring 724 may prevent plasma from passing between the top edge ring 724 and the middle inner edge ring 728 to an inner surface of the movable edge ring 708. When the movable edge ring 708 raises the top edge ring 724, a gap is made between the top edge ring 724 and the middle inner edge ring 728 allowing plasma to reach the inner surface of the movable edge ring 708.

In one embodiment, the entire outer surface of the movable edge ring 708 may be processed to include the aluminum layer 616/anodized layer 624 as provided in component 600. However, it is appreciated that only a portion of the external surface of the component needs to be processed. For example, the outer or external radial surface of movable edge ring 708 may be excluded from aluminum plating and/or anodization (e.g. with a mask or like process), such that only a plasma facing surface (e.g. central bore 608—see FIG. 6B) comprises the aluminum layer 616/anodized layer 624. Such a partial coating process may require masking portions that are not coated. A plasma facing surface is a surface that is either exposed to a plasma during plasma processing or is exposed to a reactive halogen species at high temperature and low pressure. The reactive halogen species may be formed from a remote plasma or thermally reactive fluorine. In some embodiments, points on the movable edge ring 708 are not coated since those points may be used to connect with electrodes during the electroplating process.

Furthermore, the movable edge ring 708, along with static edge ring 716, provides an RF conduction (alternating current) path to the ESC 704 to achieve more uniform plasma during chamber process to improve near-edge wafer processing uniformity, thus benefitting from the electrically conductive nature of the component 600 substrate body 604. Accordingly, the static edge ring 716 and top edge ring 724, among other components in the ESC assembly 700 and plasma processing chamber system 800, may be formed with the aluminum electroplating and anodization layers 616/624 of component 600 using the processes illustrated in FIG. 5, and FIG. 6A through FIG. 6E.

Referring back to the process disclosed in FIG. 5, the component 600 is used in a plasma processing chamber to facilitate semiconductor fabrication on the process wafer 866 (step 520). The plasma processing may be one or more processes of etching, depositing, passivating, or another plasma process. The plasma processing may also be performed in combination with nonplasma processing.

Figure 8:
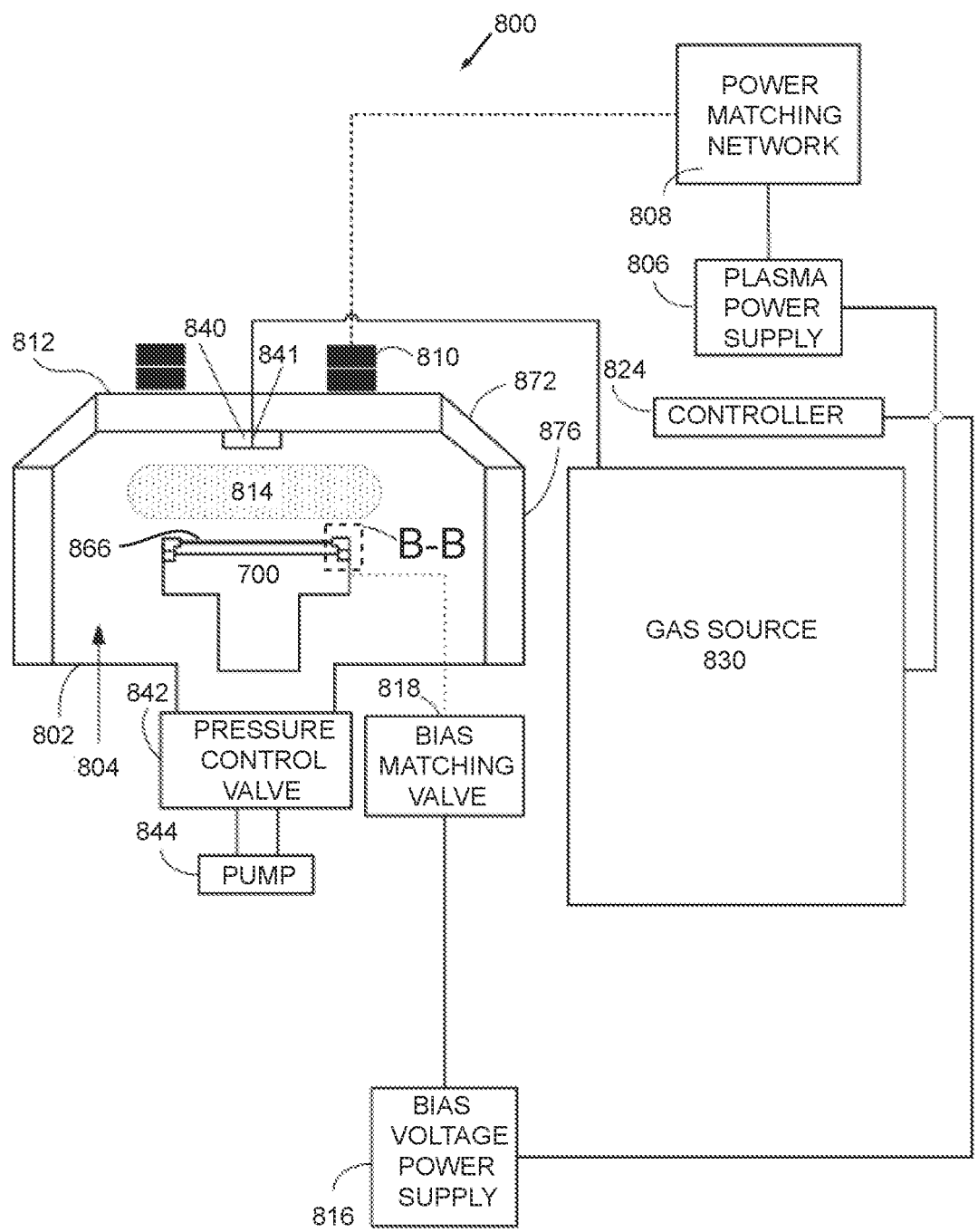
FIG. 8 is a schematic view of another plasma processing chamber that may be used in an embodiment.

To facilitate understanding, FIG. 8 schematically illustrates an example of a plasma processing chamber system 800 that may be used in an embodiment. The plasma processing chamber system 800 includes a plasma reactor 802 having a plasma processing chamber 804 therein. A plasma power supply 806, tuned by a power matching network 808, supplies power to a transformer coupled plasma (TCP) coil 810 located near a dielectric inductive power window 812 to create a plasma 814 in the plasma processing chamber 804 by providing an inductively coupled power. A pinnacle 872 extends from a chamber wall 876 of the plasma processing chamber 804 to the dielectric inductive power window 812, forming a pinnacle ring. The pinnacle 872 is angled with respect to the chamber wall 876 and the dielectric inductive power window 812. For example, the interior angle between the pinnacle 872 and the chamber wall 876 and the interior angle between the pinnacle 872 and the dielectric inductive power window 812 may each be greater than 90° and less than 180°. The pinnacle 872 provides an angled ring near the top of the plasma processing chamber 804, as shown. The TCP coil (upper power source) 810 may be configured to produce a uniform diffusion profile within the plasma processing chamber 804. For example, the TCP coil 810 may be configured to generate a toroidal power distribution in the plasma 814. The dielectric inductive power window 812 is provided to separate the TCP coil 810 from the plasma processing chamber 804 while allowing energy to pass from the TCP coil 810 to the plasma processing chamber 804. A wafer bias voltage power supply 816 tuned by a bias matching network 818 provides power to ESC assembly 700 to set the bias voltage when a process wafer 866 is placed on the ESC assembly 700. A controller 824 controls the plasma power supply 806 and the wafer bias voltage power supply 816.

The plasma power supply 806 and the wafer bias voltage power supply 816 may be configured to operate at specific radio frequencies such as, for example, 13.56 megahertz (MHz), 27 MHz, 2 MHz, 60 MHz, 400 kilohertz (kHz), 2.54 gigahertz (GHz), or combinations thereof. Plasma power supply 806 and wafer bias voltage power supply 816 may be appropriately sized to supply a range of powers in order to achieve the desired process performance. For example, in one embodiment, the plasma power supply 806 may supply the power in a range of 50 to 5000 Watts, and the wafer bias voltage power supply 816 may supply a bias voltage in a range of 20 to 3000 volts (V). In addition, the TCP coil 810 and/or the ESC assembly 700 may be comprised of two or more sub-coils or sub-electrodes. The sub-coils or sub-electrodes may be powered by a single power supply or powered by multiple power supplies.

As shown in FIG. 8, the plasma processing chamber system 800 further includes a gas source/gas supply mechanism 830. The gas source 830 is in fluid connection with plasma processing chamber 804 through a gas inlet, such as a gas injector 840. The gas injector 840 has at least one borehole 841 to allow gas to pass through the gas injector 840 into the plasma processing chamber 804. The gas injector 840 may be located in any advantageous location in the plasma processing chamber 804 and may take any form for injecting gas. Preferably, however, the gas inlet may be configured to produce a "tunable" gas injection profile. The tunable gas injection profile allows independent adjustment of the respective flow of the gases to multiple zones in the plasma process chamber 804. More preferably, the gas injector is mounted to the dielectric inductive power window 812. The gas injector may be mounted on, mounted in, or form part of the power window. The process gases and by-products are removed from the plasma process chamber 804 via a pressure control valve 842 and a pump 844. The pressure control valve 842 and pump 844 also serve to maintain a particular pressure within the plasma processing chamber 804. The pressure control valve 842 can maintain a pressure of less than 1 Torr during processing. One or more edge rings may be placed around a top part of the ESC assembly 700. The gas source/gas supply mechanism 830 is controlled by the controller 824. A Kiyo®, Strata®, or Vector® by Lam Research Corp.® of Fremont, CA, may be used to practice an embodiment.

A process wafer 866 is placed in the plasma processing chamber 804, and in particular on or within the ESC assembly 700, as shown in FIG. 8. A plasma process is applied to the process wafer 866 (e.g. step 120 of FIG. 1). In this example, the plasma processing of the process wafer 866 is used to provide an etch of part of a stack on the process wafer 866, such as for etching a tungsten containing layer in the stack. In this embodiment, the plasma process heats up to a temperature above 550° C. In addition, the plasma process deposits residue on the interior of the plasma processing chamber 804. After the plasma processing of the process wafer 866, the process wafer 866 is removed from the plasma processing chamber 804. The plasma processing chamber 804 is cleaned to remove deposited residue. In this embodiment, a reactive fluorine from a remote fluorine plasma is used to clean the interior of the plasma processing chamber 804. A pressure in the range of 1 milliTorr (mTorr) to 10 Torr is provided. The ESC assembly 700 has not sufficiently cooled and remains at a temperature above 500° C. After the cleaning is completed, a new process wafer 866 may be placed in the plasma processing chamber 804 to begin a new cycle. In another example, the plasma processing is used to provide an etch comprising a carbon layer, polysilicon layer, or oxide/nitride layer. In such example, wafer temperature control in the range of 0° C. to 150° C. and the chamber is cleaned after wafer processing by in-situ O2 and NF3 plasma.

In various embodiments, the aluminum electroplating and anodization layers 616/624 and features of component 600 may be implemented in various parts of a plasma processing chamber 804, such as confinement rings, edge rings, the electrostatic chuck, ground rings, chamber liners, door liners, the pinnacle, a showerhead, a dielectric power window, gas injectors, edge rings, ceramic transfer arms, or other components. For example, the aluminum electroplating and anodization layer may be formed on a top edge ring 724. While the component 600 and ESC assembly 700 are shown in the embodiment of FIG. 8 with reference to use in an inductively coupled plasma (ICP) reactor for the plasma processing chamber system 800, it is appreciated that other components and/or types of plasma processing chambers may be used. Examples of other types of plasma processing chambers in which the component 600 may be used are capacitively coupled plasma processing chambers (CCP's), bevel plasma processing chambers, and the like processing chambers. In another example, the plasma processing chamber may be a dielectric processing chamber or conductor processing chamber. An example of such a plasma processing chamber is the Exelan Flex® etch system manufactured by Lam Research Corporation® of Fremont, CA.

Unlike metal alloys, the substantially pure aluminum (at least 99% pure aluminum by mass) that is anodized reduces the inherent risk of contamination. The substantially pure aluminum allows the subsequent anodization of the aluminum oxide layer 614 to be free from defects and voids. The high purity aluminum material also provides an added benefit of significantly reduced plasma etch chamber contamination from substrates or in the anodized layer. This superior structure leads to the improvements in corrosion, dielectric, and abrasion performance compared to a stand-alone standard acid anodization on metal matrix composites.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A component for use in a semiconductor processing chamber, comprising:
    a component body made of an electrically conductive silicon containing material having coefficient of thermal expansion of less than $10.0 \times 10^{-6}$/K;
    a conformal aluminum barrier layer over a surface of the component body; and
    an aluminum oxide layer disposed over a surface of the aluminum barrier layer, wherein the aluminum oxide layer has a thickness between about 12 µm to 38 µm.

2. The component, as recited in claim 1, wherein the electrically conductive silicon comprises doped silicon.

3. The component, as recited in claim 1, wherein the electrically conductive silicon containing material has a coefficient of thermal expansion of less than $5.0 \times 10^{-6}$/K.

4. The component, as recited in claim 1, wherein the conformal aluminum barrier layer has a thickness between about 20 micrometers (µm) to 150 µm.

5. The component, as recited in claim 1, wherein the conformal aluminum barrier layer is at least 99.9% pure by mass.

6. The component, as recited in claim 1, wherein the component is at least one of an electrode, a showerhead, an edge ring, or a high flow liner for use in the plasma processing chamber.

7. The component, as recited in claim 6, wherein the component forms an edge ring around an electrostatic chuck within the plasma processing chamber, the electrostatic chuck supporting a wafer for processing.

* * * * *